(12) United States Patent
Lee et al.

(10) Patent No.: US 9,224,867 B2
(45) Date of Patent: Dec. 29, 2015

(54) THIN FILM TRANSISTOR ARRAY PANEL AND METHOD OF MANUFACTURING THE SAME

(71) Applicant: SAMSUNG DISPLAY CO., LTD., Yongin, Gyeonggi-Do (KR)

(72) Inventors: Eu Gene Lee, Asan-Si (KR); Min-Chul Song, Cheonan-Si (KR); Sung Man Kim, Seoul (KR); Young Je Cho, Asan-Si (KR); Hwa Yeul Oh, Seoul (KR); Hyun Ki Hwang, Seongnam-Si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 31 days.

(21) Appl. No.: 14/180,617

(22) Filed: Feb. 14, 2014

(65) Prior Publication Data
US 2014/0231814 A1 Aug. 21, 2014

(30) Foreign Application Priority Data
Feb. 15, 2013 (KR) .................. 10-2013-0016480

(51) Int. Cl.
| H01L 27/14 | (2006.01) |
| G02F 1/1343 | (2006.01) |
| H01L 29/786 | (2006.01) |
| H01L 27/32 | (2006.01) |
| H01L 27/12 | (2006.01) |

(52) U.S. Cl.
CPC ........ *H01L 29/786* (2013.01); *G02F 1/134309* (2013.01); *G02F 1/134336* (2013.01); *G02F 1/134363* (2013.01); *H01L 27/3248* (2013.01); *H01L 27/3258* (2013.01); *H01L 27/3262* (2013.01); *H01L 27/124* (2013.01)

(58) Field of Classification Search
CPC ............ G02F 1/1333; G02F 1/134309; G02F 1/134318; G02F 1/134336; H01L 27/3248; H01L 27/3258; H01L 27/3262
USPC ............... 257/59, 72; 438/151, 708; 349/141, 349/142, 143
See application file for complete search history.

(56) References Cited

U.S. PATENT DOCUMENTS

| 7,511,781 B2 | 3/2009 | Hideo |
| 7,763,482 B2 | 7/2010 | Kim |
| 8,294,863 B2 | 10/2012 | Ninomiya et al. |

(Continued)

FOREIGN PATENT DOCUMENTS

| JP | 2010-102220 | 5/2010 |
| KR | 10-0271043 | 11/2000 |
| KR | 10-2002-0054918 | 7/2002 |

(Continued)

*Primary Examiner* — Minh-Loan Tran
(74) *Attorney, Agent, or Firm* — F. Chau & Associates, LLC

(57) ABSTRACT

In a thin film transistor array panel and a method of manufacturing the same, a thin passivation layer is positioned between a first field generating electrode and a second field generating electrode. The thin passivation layer overlaps the first and second field generating electrodes. The thin passivation layer includes a transparent photosensitive organic material. When forming the first field generating electrode, the passivation layer is used as a photosensitive film. Accordingly, the passivation layer and the first field generating electrode may be formed using a same single photo-mask. Accordingly, the manufacturing cost of the thin film transistor array panel may be reduced.

11 Claims, 41 Drawing Sheets

(56) References Cited

U.S. PATENT DOCUMENTS

| | | | |
|---|---|---|---|
| 2010/0072882 A1* | 3/2010 | Hwang et al. | 313/504 |
| 2011/0058133 A1 | 3/2011 | Ishigaki et al. | |
| 2011/0085105 A1* | 4/2011 | Park et al. | 349/54 |
| 2012/0057110 A1 | 3/2012 | Ishiguro et al. | |

FOREIGN PATENT DOCUMENTS

| KR | 10-0466387 | 1/2005 |
|---|---|---|
| KR | 10-2005-0066665 | 6/2005 |
| KR | 10-2012-0107269 | 10/2012 |
| KR | 10-2012-0116651 | 10/2012 |

* cited by examiner

THIN FILM TRANSISTOR ARRAY PANEL AND METHOD OF MANUFACTURING THE SAME

CROSS-REFERENCE TO RELATED APPLICATION

This U.S. non-provisional application claims priority under 35 U.S.C. §119 to Korean Patent Application No. 10-2013-0016480 filed in the Korean Intellectual Property Office on Feb. 15, 2013, the disclosure of which is incorporated by reference herein in its entirety.

TECHNICAL FIELD

Exemplary embodiments of the present invention relate to displays, and more specifically, to a thin film transistor array panel and a method of manufacturing the same.

DISCUSSION OF THE RELATED ART

To realize a wide viewing angle, a liquid crystal display may have a pixel electrode and a common electrode formed on the same substrate.

At least one of the pixel electrode and the common electrode may have a plurality of branch electrodes formed therein.

Different photo-masks may be used to form the pixel electrode, the common electrode, and a passivation layer, respectively, thus resulting in manufacturing costs being increased as each additional photo-mask adds to the fabrication cost.

SUMMARY

A thin film transistor array panel according to an exemplary embodiment of the present invention includes an insulation substrate. A gate line and a data line are positioned on the insulation substrate. A first passivation layer is positioned on the gate line and the data line. A first field generating electrode is positioned on the first passivation layer. A second passivation layer is positioned on the first field generating electrode. The second passivation layer includes a transparent photosensitive organic material. A second field generating electrode is positioned on the second passivation layer.

The second passivation layer may cover a side surface of an edge of the first field generating electrode.

The second passivation layer may have substantially the same planar shape as the first field generating electrode. An edge of the second passivation layer may protrude from the edge of the first field generating electrode.

The edge of the second passivation layer may protrude by more than about 1 µm from the edge of the first field generating electrode.

The second passivation layer may have a dielectric constant of about 2 F/m to about 20 F/m.

One of the first field generating electrode or the second field generating electrode may have a planar shape, and the other may include a branch electrode.

A method of manufacturing a thin film transistor array panel according to an exemplary embodiment of the present invention is provided. A gate line and a data line are formed on an insulation substrate. A first passivation layer is formed on the gate line and the data line. A transparent conductor is deposited on the first passivation layer. A transparent photosensitive organic layer is formed on the transparent conductor. The transparent conductor is etched using the transparent photosensitive organic layer as an etching mask, forming a first field generating electrode. The transparent photosensitive organic layer is hard-baked, thus forming a second passivation layer. The second passivation layer covers an upper surface of the first field generating electrode and a side surface of an edge of the first field generating electrode. A second field generating electrode is formed on the second passivation layer.

A transparent photosensitive organic material may be deposited on the transparent conductor. The deposited transparent photosensitive organic material may be etched back.

The second passivation layer may have substantially the same planar shape as the first field generating electrode. An edge of the second passivation layer may protrude from the edge of the first field generating electrode.

The edge of the second passivation layer may protrude by more than about 1 µm from the edge of the first field generating electrode.

The second passivation layer may have a dielectric constant of about 2 F/m to about 20 F/m.

One of the first field generating electrode or the second field generating electrode may have a planar shape, and the other may include a branch electrode.

According to an exemplary embodiment of the present invention, a method of manufacturing a transistor array panel is provided. In the method, a signal line is formed on a substrate. A first passivation layer is formed on the signal line. A transparent conducting layer is formed on the first passivation layer. A transparent photosensitive layer is formed on the transparent conducting layer. The transparent conducting layer is etched using the transparent photosensitive layer as an etching mask, forming a field generating electrode.

The transparent photosensitive layer may be baked, forming a second passivation layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EXEMPLARY EMBODIMENTS

Figure 1:
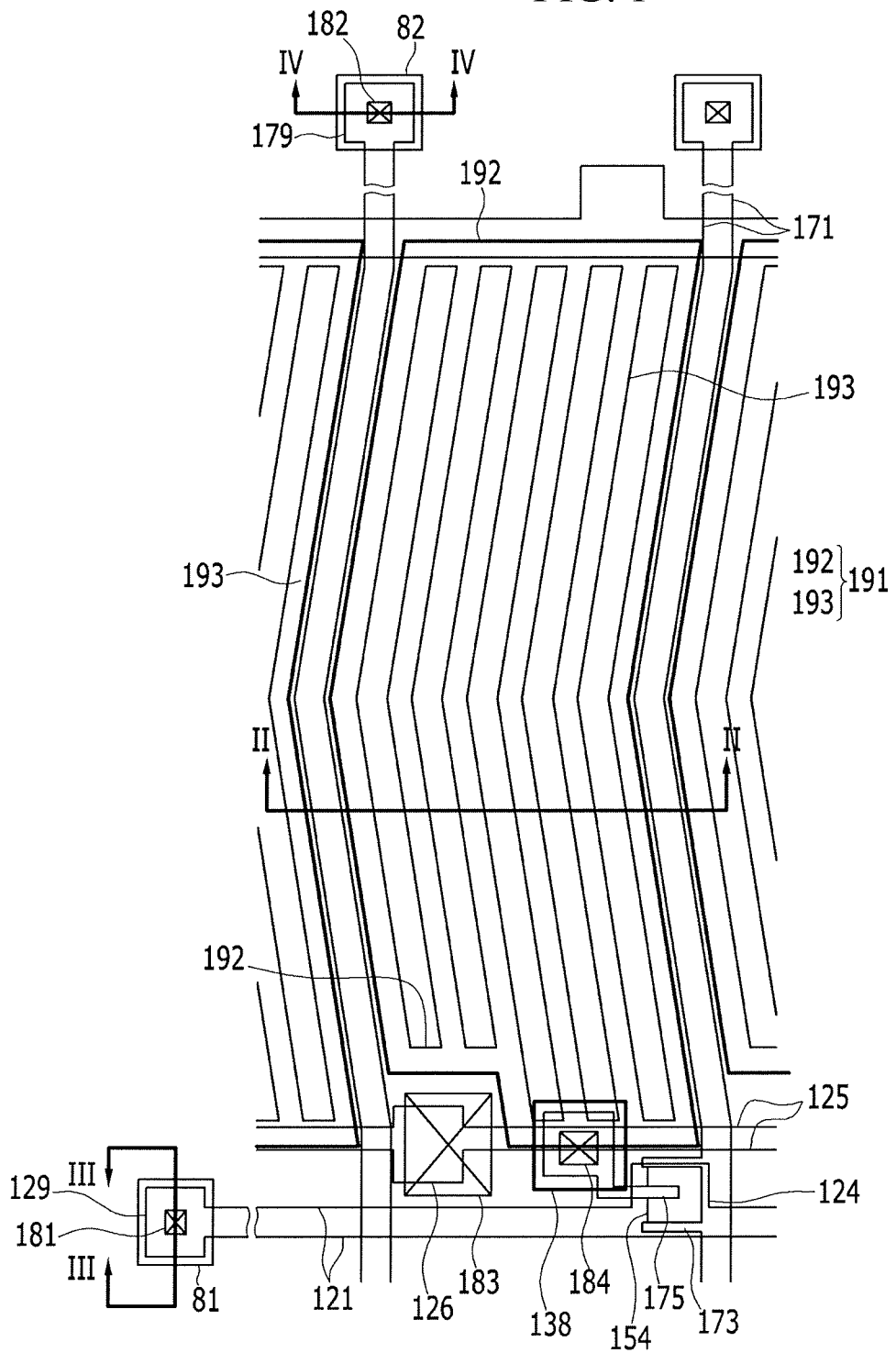
FIG. 1 is a layout view of a thin film transistor array panel according to an exemplary embodiment of the present invention.

Exemplary embodiments of the present invention will be described in more detail hereinafter with reference to the accompanying drawings. As those skilled in the art would realize, the described embodiments may be modified in various different ways.

In the drawings, the thickness of layers, films, panels, regions, etc., may be exaggerated for clarity. Like reference numerals may designate like or similar elements throughout the specification and the drawings. It will be understood that when an element is referred to as being "on," "connected to," or "coupled to" another element, it can be directly on, connected to or coupled to the other element or intervening elements may also be present.

As used herein, the singular forms "a," "an," and "the" are intended to include the plural forms as well, unless the context clearly indicates otherwise.

Figure 2:
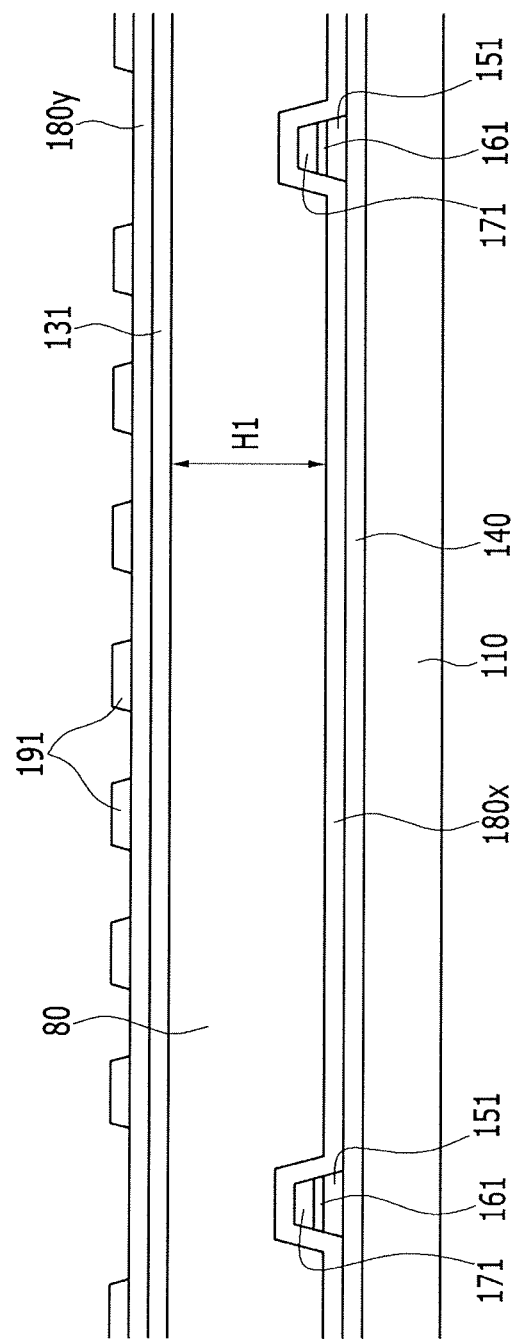
FIG. 2 is a cross-sectional view taken along line II-II of FIG. 1.
Figure 3:
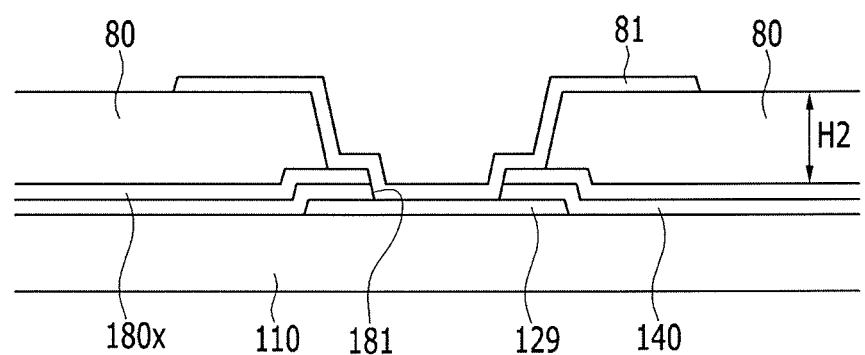
FIG. 3 is a cross-sectional view taken along line of FIG. 1.
Figure 4:
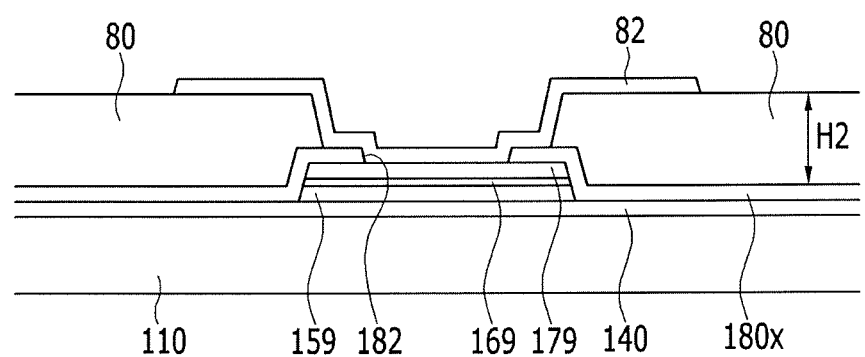
FIG. 4 is a cross-sectional view taken along line IV-IV of FIG. 1.

FIG. 1 is a layout view of a thin film transistor array panel according to an exemplary embodiment of the present invention, FIG. 2 is a cross-sectional view taken along line II-II of FIG. 1, FIG. 3 is a cross-sectional view taken along line of FIG. 1, and FIG. 4 is a cross-sectional view taken along line IV-IV of FIG. 1.

Referring to FIG. 1 to FIG. 4, a plurality of gate conductors including a gate line 121 and a common voltage line 125 are formed on an insulation substrate 110.

The gate line 121 includes a plurality of gate electrodes 124 and a gate pad 119. The gate electrodes 124 protrude in a direction substantially perpendicular to the gate line 121. The gate pad 129 has a relatively wide area and connects with another layer or an external driving circuit. A gate driving circuit for generating a gate signal may be mounted on a flexible printed circuit film attached on the substrate 110, or the gate driving circuit may be directly mounted on the substrate 110.

The common voltage line 125 transmits a predetermined voltage such as a common voltage Vcom. The common voltage line 125 extends in a direction substantially parallel to the gate line 121. The common voltage line 125 may include a plurality of expansions 126.

Gate conductors including the gate line 121, the common voltage line 125, and the gate pad 129 and each may have a single layer or a multilayer structure including at least two conductive layers.

A gate insulating layer 140 is formed on the gate conductors 121, 125, and 129. The gate insulating layer 140 may be formed of an inorganic insulator such as silicon nitride (SiNx) or silicon oxide (SiOx).

A semiconductor layer 151 is formed on the gate insulating layer 140. The semiconductor layer 151 each may have an expansion 154 extending toward the gate electrodes 124. An ohmic contact 161 is disposed on the semiconductor layer 151. Alternatively, the ohmic contact 161 may be omitted.

A plurality of data conductors including a data line 171 and a plurality of drain electrodes 175 are formed on the ohmic contact 161.

The data line 171 transmits a data signal. The data line 171 extends in a longitudinal direction. For example, the data line 171 extends in a direction substantially perpendicular to the gate line 121. The data line 171 intersects the gate line 121 and the common voltage line 125. The data line 171 includes a plurality of source electrodes 173 and a data pad 179. The source electrodes 173 extend toward the gate electrodes 124. The data pad 179 has a relatively wide area, and the data pad 179 is connected with a different layer or an external driving circuit. The data driving circuit that generates a data signal is disposed on a flexible printed circuit film that is attached to the substrate 110, or the data driving circuit is directly disposed on the substrate 110.

Each drain electrode 175 includes one end having a bar shape and another end having a relatively wide area that faces each source electrode 173 with respect to each gate electrode 124.

A first semiconductor layer 159 and a first ohmic contact 169 are disposed under the data pad 179. Alternatively, the first semiconductor layer 159 and the first ohmic contact 169 may be omitted.

Data conductors including the data line 171, the drain electrode 175, and the data pad 179 each may have a single layer or a multilayer structure including at least two conductive layers.

One gate electrode 124, one source electrode 173, and one drain electrode 175, along with one expansion 154 of the semiconductor layer 151, form a thin film transistor (TFT) that functions as a switching element. The semiconductor layer 151 may have substantially the same planar shape as the data conductors 171, 175, and 179 except for the channel of the thin film transistor.

A first passivation layer 180x is positioned on the data line 171, the drain electrodes 175, and the exposed expansions 154 of the semiconductor layer 151. The first passivation layer 180x may be formed of an organic insulating material or an inorganic insulating material.

An organic layer 80 is positioned on the first passivation layer 180x. The organic layer 80 is thicker than the first passivation layer 180x. The organic layer 80 may have a flat surface.

A first thickness H1 of the organic layer 80 positioned in a display area where a plurality of pixels are disposed to display an image is larger than a second thickness H2 of the organic layer 80 positioned in a peripheral area where the gate pad 129 or the data pad 179 are positioned.

Alternatively, the organic layer 80 may be omitted.

According to an exemplary embodiment of the present invention, the organic layer 80 may include a color filter, and in this case, a layer may be disposed on the organic layer 80. For example, an overcoat (capping layer) may be disposed on the color filter to prevent a pigment of the color filter from flowing into the liquid crystal layer. The overcoat may be formed of an insulating material such as silicon nitride (SiNx).

The first passivation layer 180x, the organic layer 80, and the gate insulating layer 140 have a first contact hole 181 that exposes the gate pad 129.

The first passivation layer 180x and the organic layer 80 have a second contact hole 182 that exposes the data pad 179.

The first passivation layer 180x, the organic layer 80, and the gate insulating layer 140 have a third contact hole 183 that exposes a portion of the common voltage line 125.

A common electrode 131 is formed on the organic layer 80. The common electrode 131 may be formed of a transparent conductive material such as ITO (Indium Tin Oxide) or IZO (Indium Zinc Oxide). The common electrode 131 is electrically connected to the common voltage line 125 through the third contact hole 183 thereby receiving a predetermined voltage such as a common voltage from the common voltage line 125. The common electrode 131 according to an exemplary embodiment has a planar shape. The common electrode 131 may be formed as one plate on an entire surface of the substrate 110. The common electrode 131 has an opening 138 that is formed at a position where a fourth contact hole 184 exposing each drain electrode 175 is later formed.

A second passivation layer 180y is formed on the common electrode 131.

The second passivation layer 180y includes a transparent photosensitive organic material. The second passivation layer 180y is thinner than the organic layer 80. The second passivation layer 180y has a dielectric constant of about 2 F/m to about 20 F/m.

The second passivation layer 180y covers a side surface of an edge of the common electrode 131. The upper portion and the side surface of the edge of the common electrode 131 are covered by the second passivation layer 180y having a thickness of more than about 1 μm.

For example, the second passivation layer 180y has substantially the same planar shape as the common electrode 131. An edge of the second passivation layer 180y protrudes from an edge of the common electrode 131 by more than about 1 μm.

The pixel electrode 191 is formed on the second passivation layer 180y. The pixel electrode 191 may be formed of a transparent conductive material such as ITO (Indium Tin Oxide) or IZO (Indium Zinc Oxide).

The first passivation layer 180x, the organic layer 80, and the second passivation layer 180y have a fourth contact hole 184 that exposes a portion of the drain electrode 175. The pixel electrode 191 is electrically connected to the drain electrode 175 through the fourth contact hole 184 thereby receiving a data voltage. The pixel electrode 191 includes a plurality of branch electrodes 193 and lower and upper transverse portions 192. The branch electrodes are substantially parallel to each other and are separated from each other. The lower and upper transverse portions 192 are connected with upper and lower ends of the branch electrodes 193. The branch electrodes 193 of the pixel electrode 191 each may have a bend along the data line 171.

A first contact assistant 81 is formed on the gate pad 129 that is exposed through the first contact hole 181, and a second contact assistant 82 is formed on the data pad 179 that is exposed through the second contact hole 182.

The pixel electrode 191 is applied with a data voltage and generates an electric field in a liquid crystal layer along with the common electrode 131 that is applied with a common voltage.

According to an exemplary embodiment of the present invention, the second passivation layer 180y is formed relatively thin and includes a transparent photosensitive organic material. Accordingly, when the common electrode 131 is formed under the second passivation layer 180y, the second passivation layer 180y may be used as a photosensitive film, and thus, the second passivation layer 180y and the common electrode 131 may be formed substantially simultaneously. For example, the second passivation layer 180y and the common electrode 131 may be formed using a same single photomask. Accordingly, the manufacturing cost of the liquid crystal display may be reduced.

According to an exemplary embodiment of the present invention, the common electrode 131 is disposed under the second passivation layer 180y, and the pixel electrode 191 is disposed on the second passivation layer 180y. Alternatively, the pixel electrode 191 may be disposed under the second passivation layer 180y, and the common electrode 131 may be disposed on the second passivation layer 180y. One of the common electrode 131 and the pixel electrode 191 may include branch electrodes and the other may have a planar shape.

FIG. 5, FIG. 8, FIG. 11, FIG. 14, FIG. 17, and FIG. 20 sequentially show a method of manufacturing a thin film transistor array panel according to an exemplary embodiment of the present invention. FIG. 5, FIG. 8, FIG. 11, FIG. 14, FIG. 17, and FIG. 20 are cross-sectional views taken along line II-II of FIG. 1. FIG. 6, FIG. 9, FIG. 12, FIG. 15, FIG. 18, and FIG. 21 sequentially show a method of manufacturing a thin film transistor array panel according to an exemplary embodiment of the present invention. FIG. 6, FIG. 9, FIG. 12, FIG. 15, FIG. 18, and FIG. 21 are cross-sectional views taken along line III-III of FIG. 1. FIG. 7, FIG. 10, FIG. 13, FIG. 16, FIG. 19, and FIG. 22 sequentially show a method of manufacturing a thin film transistor array panel according to an exemplary embodiment of the present invention. FIG. 7, FIG. 10, FIG. 13, FIG. 16, FIG. 19, and FIG. 22 are cross-sectional views taken along line IV-IV of FIG. 1.

Figure 5:
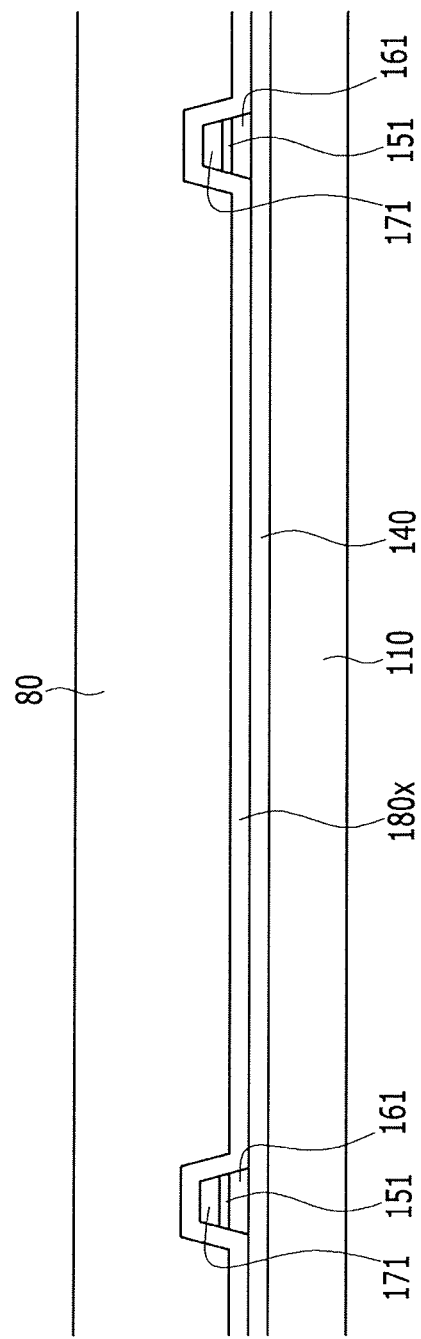
FIG. 5, FIG. 8, FIG. 11, FIG. 14, FIG. 17, and FIG. 20 are cross-sectional views taken along line II-II of FIG. 1, sequentially showing a method of manufacturing a thin film transistor array panel according to an exemplary embodiment of the present invention.
Figure 6:
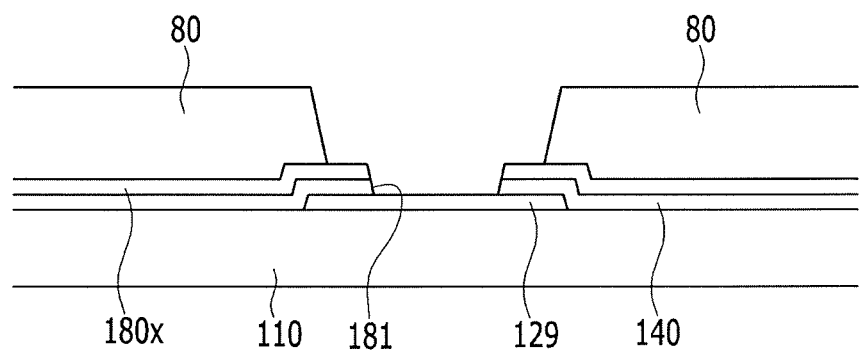
FIG. 6, FIG. 9, FIG. 12, FIG. 15, FIG. 18, and FIG. 21 are cross-sectional views taken along line III-III of FIG. 1, sequentially showing a method of manufacturing a thin film transistor array panel according to an exemplary embodiment of the present invention.
Figure 7:
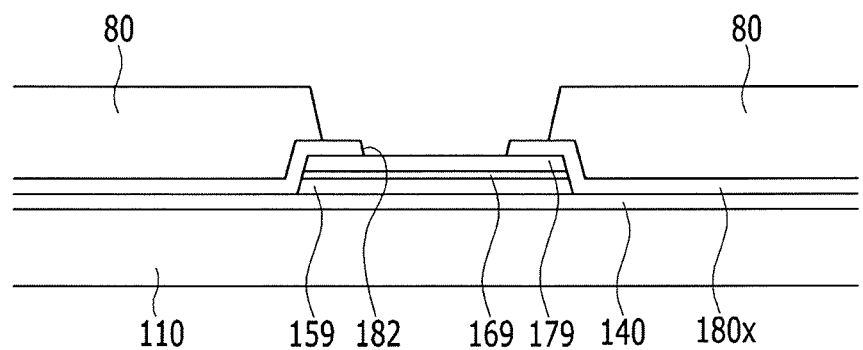
FIG. 7, FIG. 10, FIG. 13, FIG. 16, FIG. 19, and FIG. 22 are cross-sectional views taken along line IV-IV of FIG. 1, sequentially showing a method of manufacturing a thin film transistor array panel according to an exemplary embodiment of the present invention.

Referring to FIG. 5 to FIG. 7, gate conductors 121, 125, and 129 including a gate line 121, a common voltage line 125, and a gate pad 129 are formed on an insulation substrate 110, and a gate insulating layer 140 is formed on the gate conductors 121, 125, and 129. A semiconductor layer 151 having an expansion 154, a first semiconductor layer 159, an ohmic contact 161, a first ohmic contact 169, and data conductors 171, 175, and 179 including a data line 171, a drain electrode 175, and a data pad 179 are formed on the gate insulating layer 140.

The first passivation layer 180x is deposited on the data conductors 171, 175, and 179 and the exposed expansion 154 of the semiconductor layer 151. An organic layer 80 is deposited on the first passivation layer 180x.

The first contact hole 181 that exposes the gate pad 129 is formed through the first passivation layer 180x, the organic layer 80, and the gate insulating layer 140. The second contact hole 182 that exposes the data pad 179 is formed through the first passivation layer 180x and the organic layer 80. The third contact hole 183 that exposes a portion of the common voltage line 125 is formed through the first passivation layer 180x, the organic layer 80, and the gate insulating layer 140.

Figure 8:
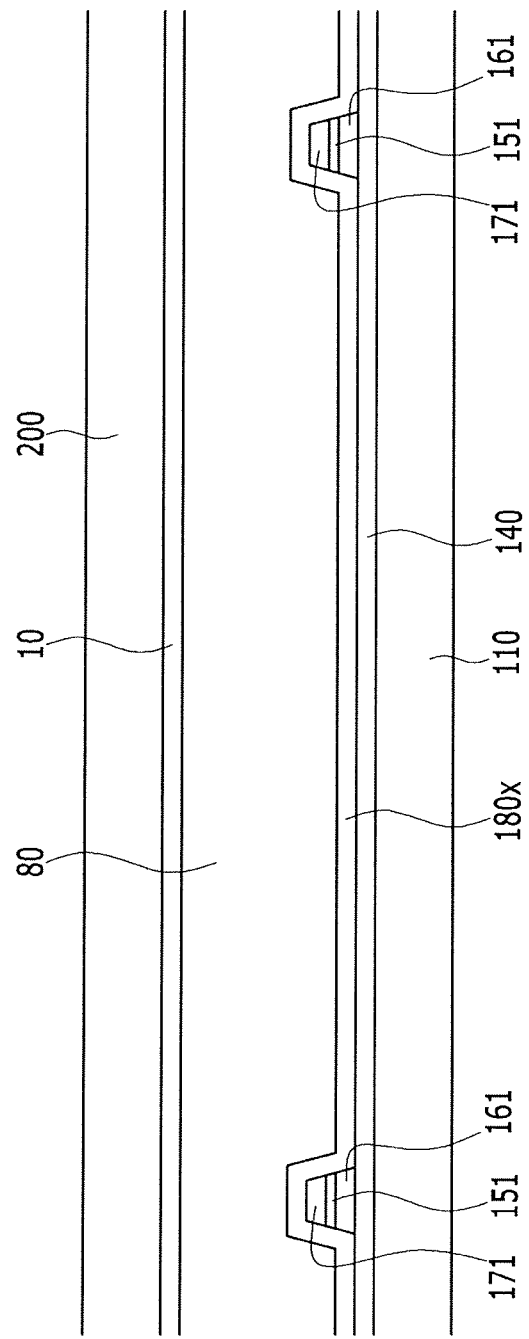
Figure 9:
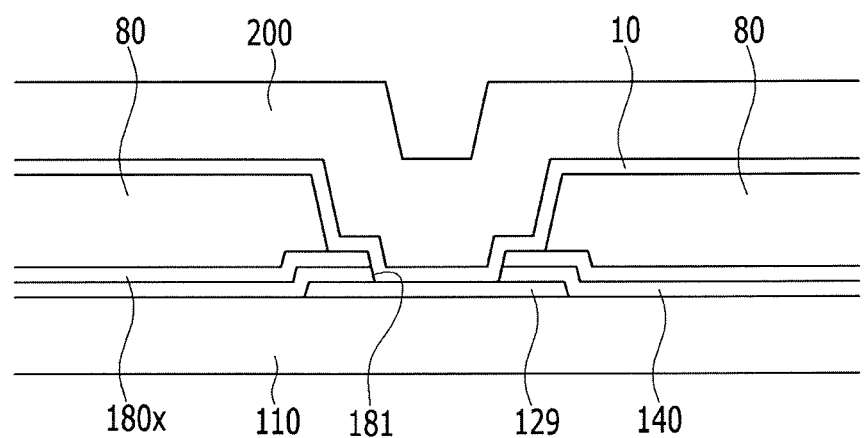
Figure 10:
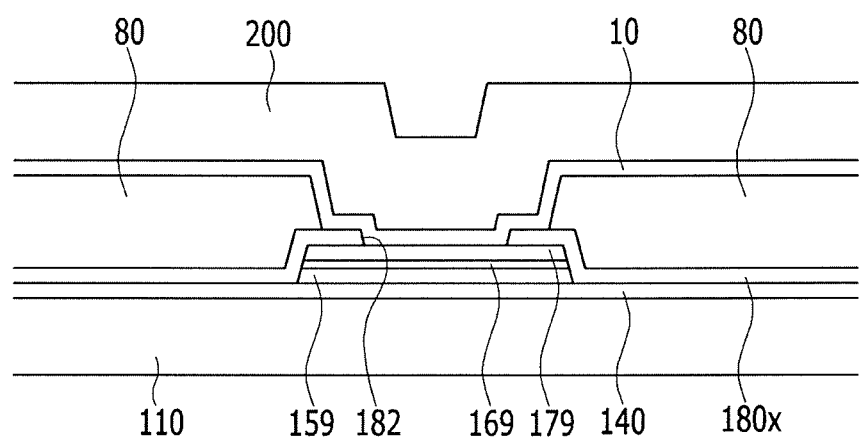

Referring to FIG. 8 to FIG. 10, a first layer 10 including a transparent conductor such as ITO or IZO is deposited on the organic layer 80, and the gate pad 129, and the data pad 179. A first photosensitive organic layer 200 is deposited on the first layer 10. The first photosensitive organic layer 200 includes a transparent photosensitive organic material. The first photosensitive organic layer 200 is thinner than the organic layer 80. The first photosensitive organic layer 200 has a dielectric constant of about 2 F/m to about 20 F/m.

Figure 11:
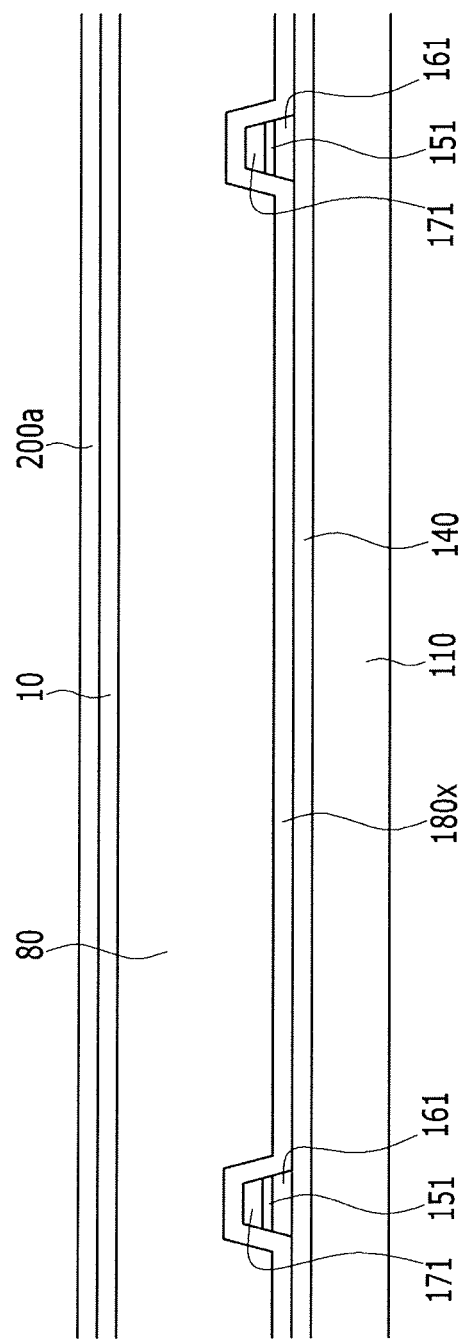
Figure 12:
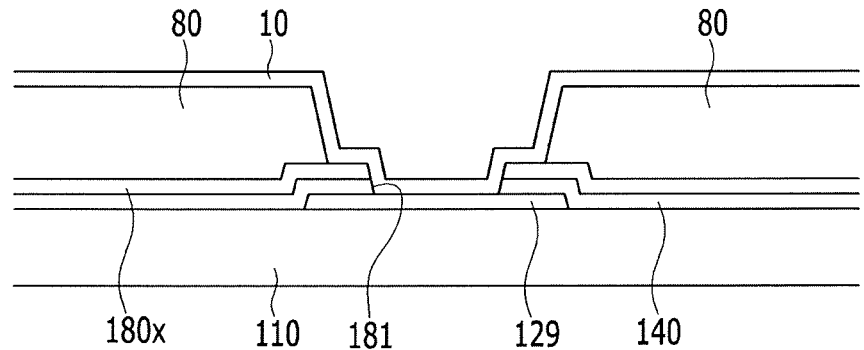
Figure 13:
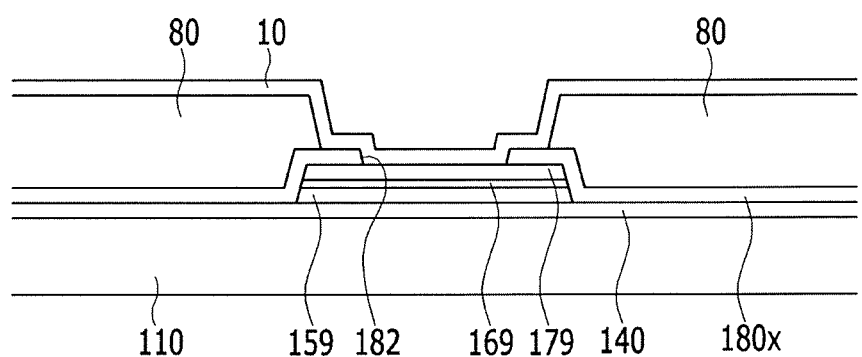

Referring to FIG. 11 to FIG. 13, the first photosensitive organic layer 200 is etched back to form a second photosensitive organic layer 200a having a thin thickness and a flat surface. The second photosensitive organic layer 200a is disposed at the position where the common electrode 131 is formed, and the first photosensitive organic layer 200 positioned in the region corresponding to the gate pad 129 and the data pad 179 is removed.

According to an exemplary embodiment of the present invention, the first photosensitive organic layer 200 is deposited and then etched back, thus forming the thin second photosensitive organic layer 200a that has the flat surface. Alternatively, the thin photosensitive organic layer having the flat surface may be formed by a coating method.

Figure 14:
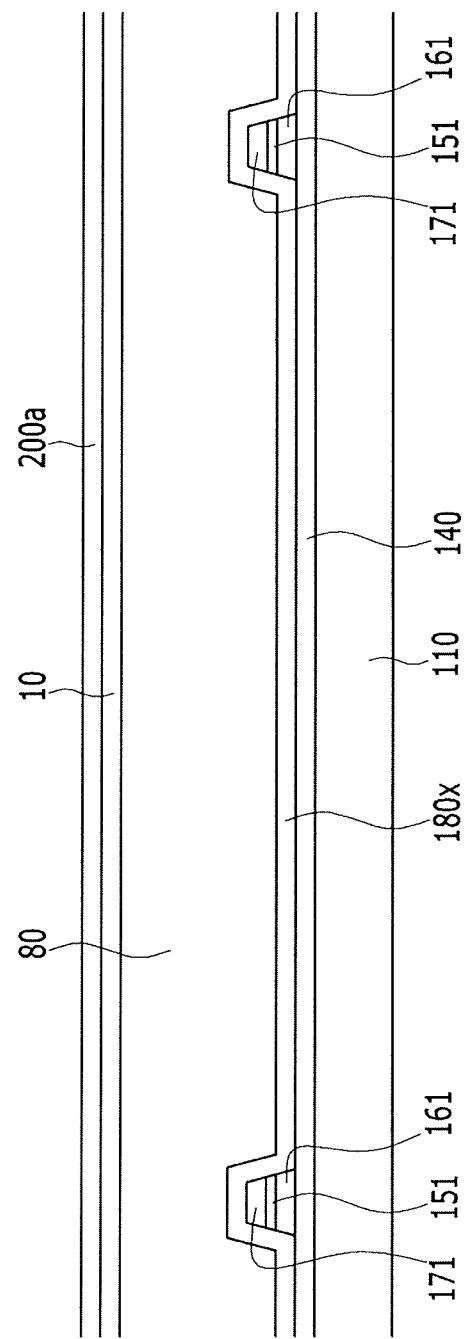
Figure 15:
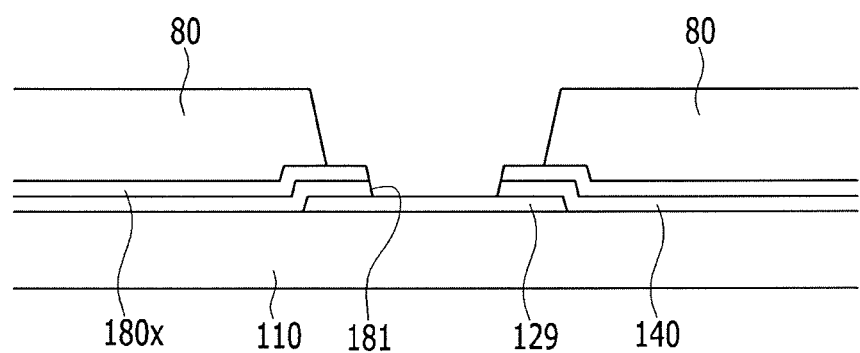
Figure 16:
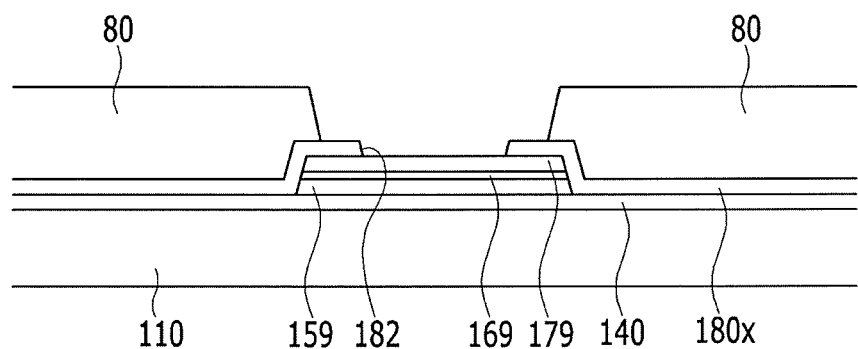

Referring to FIG. 14 to FIG. 16, the first layer 10 is etched using the second photosensitive organic layer 200a as an etching mask, forming a common electrode 131 and exposing the gate pad 129 and the data pad 179.

Figure 17:
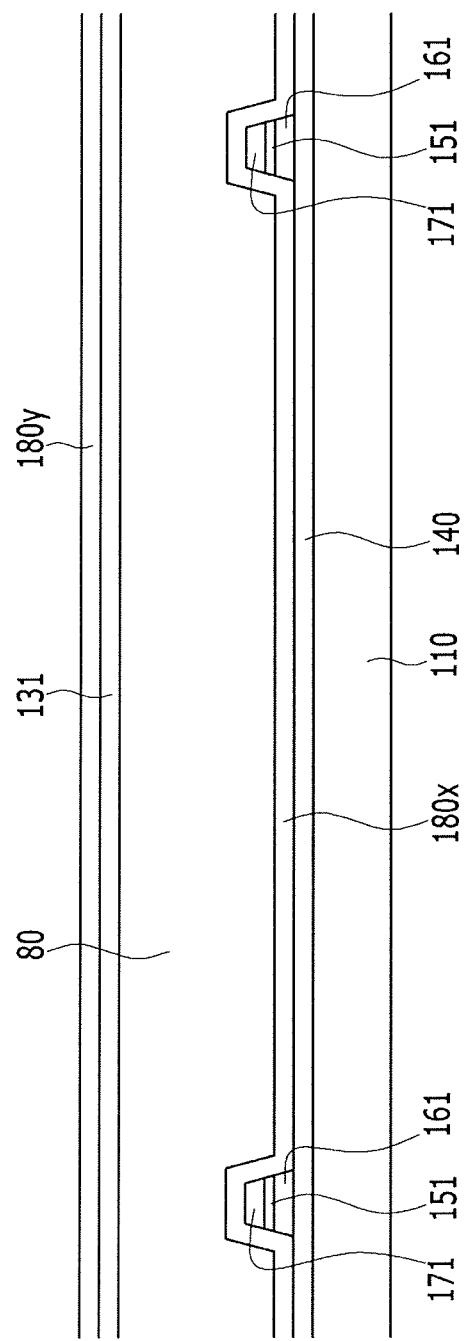
Figure 18:
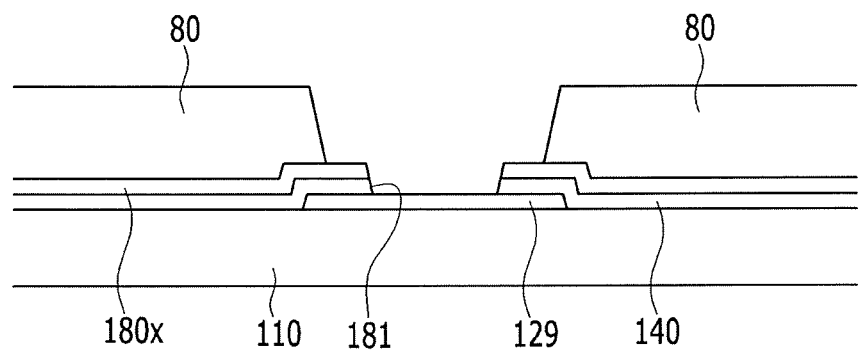
Figure 19:
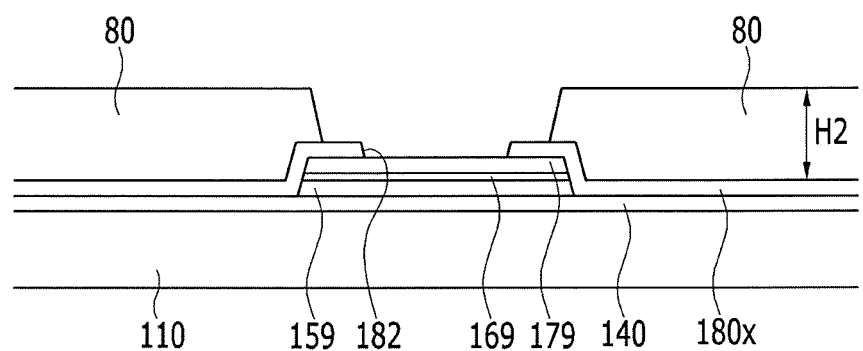

Referring to FIG. 17 to FIG. 19, the second photosensitive organic layer 200a is hard baked, forming the second passivation layer 180y covering a side surface of an edge of the common electrode 131.

The second passivation layer 180y having a thickness of more than about 1 μm covers an upper surface and a side surface of the edge of the common electrode 131.

The second passivation layer 180y has substantially the same planar shape as the common electrode 131. An edge of the second passivation layer 180y protrudes from the edge of the common electrode 131 by more than about 1 μm.

Figure 20:
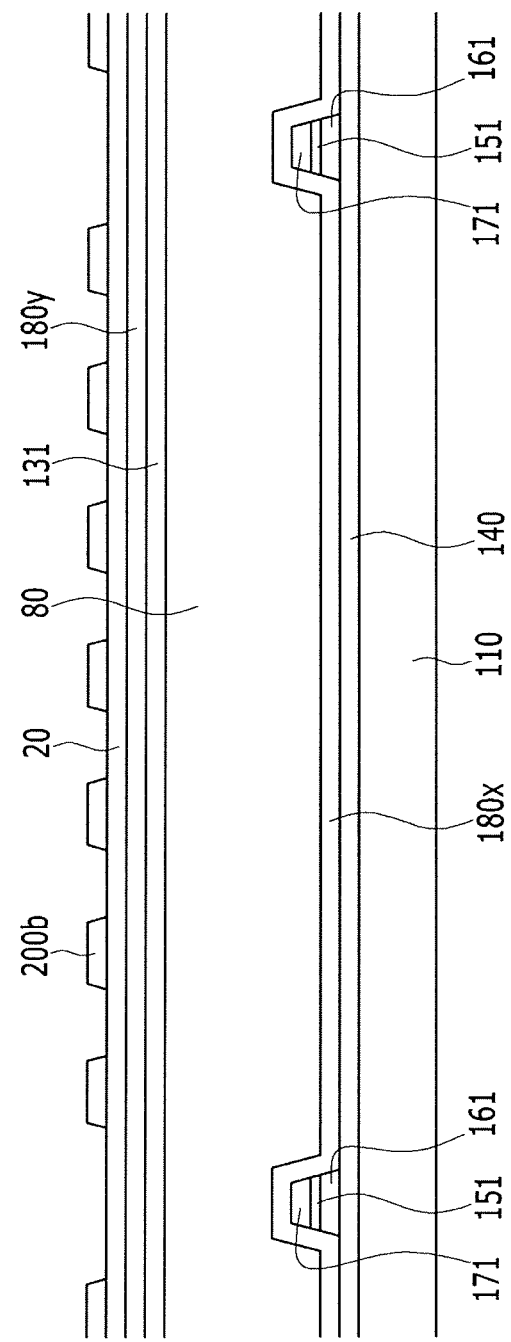
Figure 21:
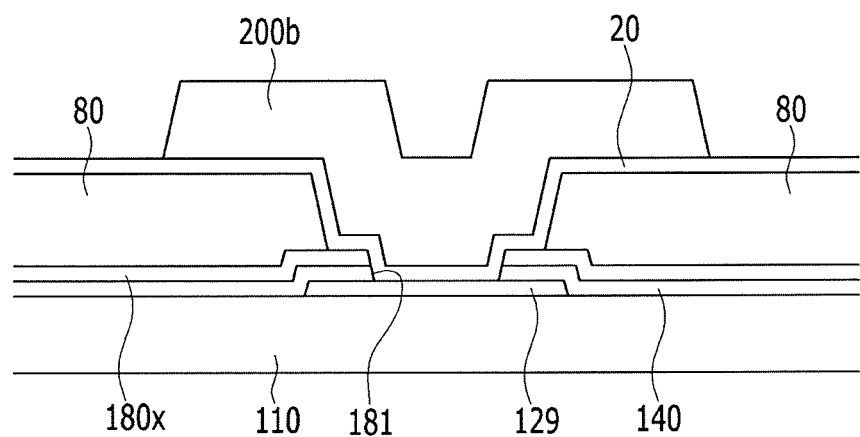
Figure 22:
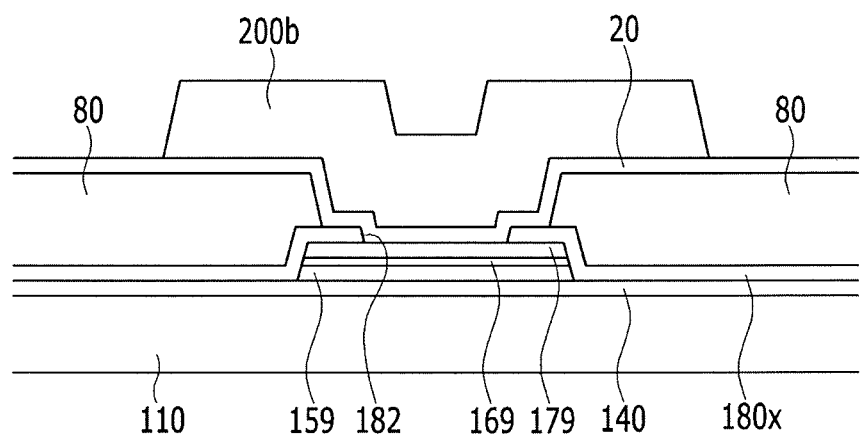

Referring to FIG. 20 to FIG. 22, a second layer 20 including a transparent conductor such as ITO or IZO is deposited on the second passivation layer 180y, the gate pad 129, and the data pad 179. A photosensitive film is deposited on the second layer 20 and is then exposed and developed, forming a photosensitive film pattern 200b.

The second layer 20 is etched using the photosensitive film pattern 200b as an etching mask, forming a pixel electrode 191 having a plurality of branch electrodes 193, a first contact assistant 81, and a second contact assistant 82. The photosensitive film pattern 200b is removed, thereby forming the thin film transistor array panel shown in FIG. 1 to FIG. 4.

In a method of manufacturing a thin film transistor array panel according to an exemplary embodiment of the present invention, when forming the common electrode 131 under the second passivation layer 180y, the second passivation layer 180y may be used as a photosensitive film, and thus, the second passivation layer 180y and the common electrode 131 may be substantially simultaneously formed. For example, the second passivation layer 180y and the common electrode 131 may be formed using a same single photo-mask. Accordingly, the manufacturing cost of the liquid crystal display may be reduced.

Figure 23:
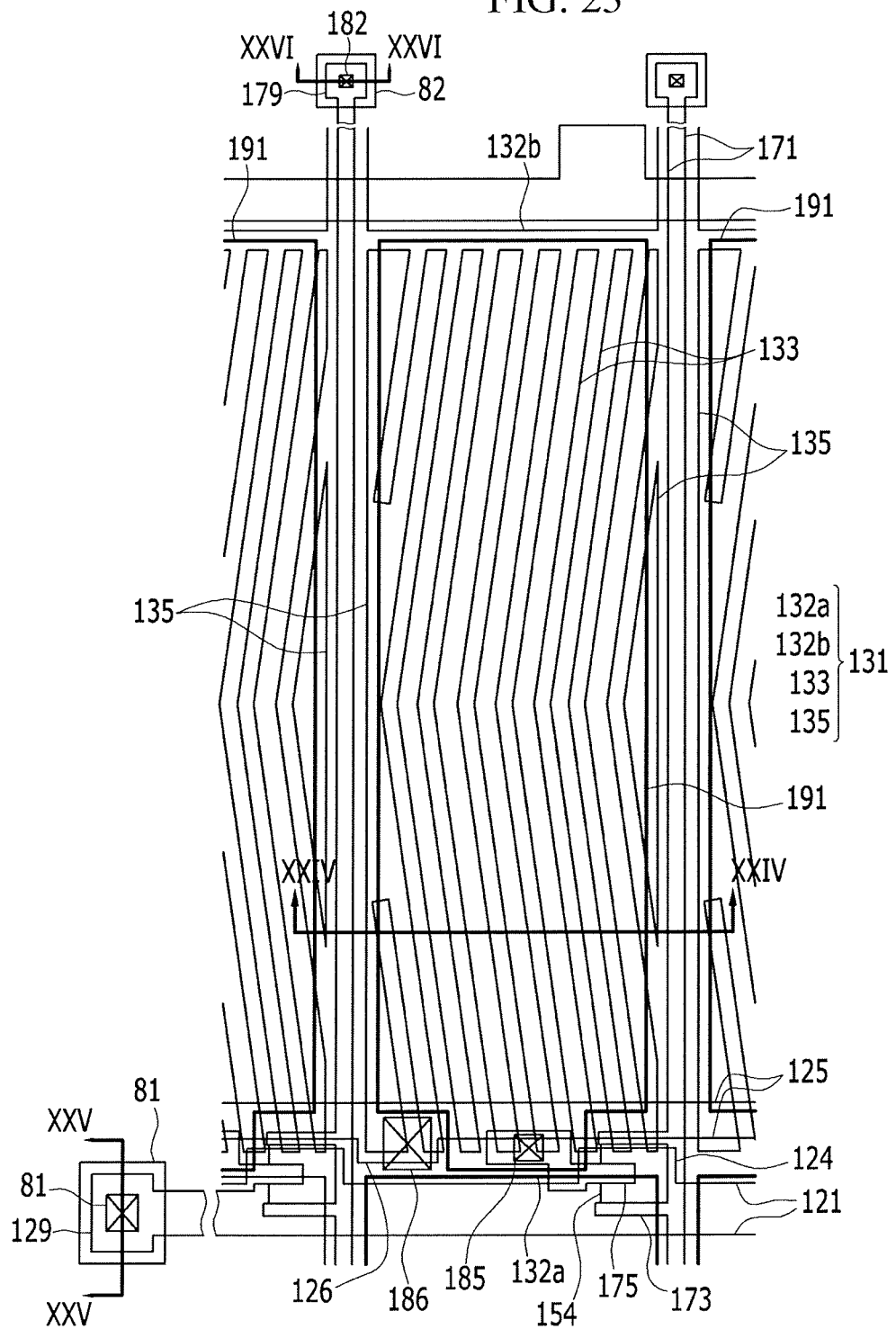
FIG. 23 is a layout view of a thin film transistor array panel according to an exemplary embodiment of the present invention.
Figure 24:
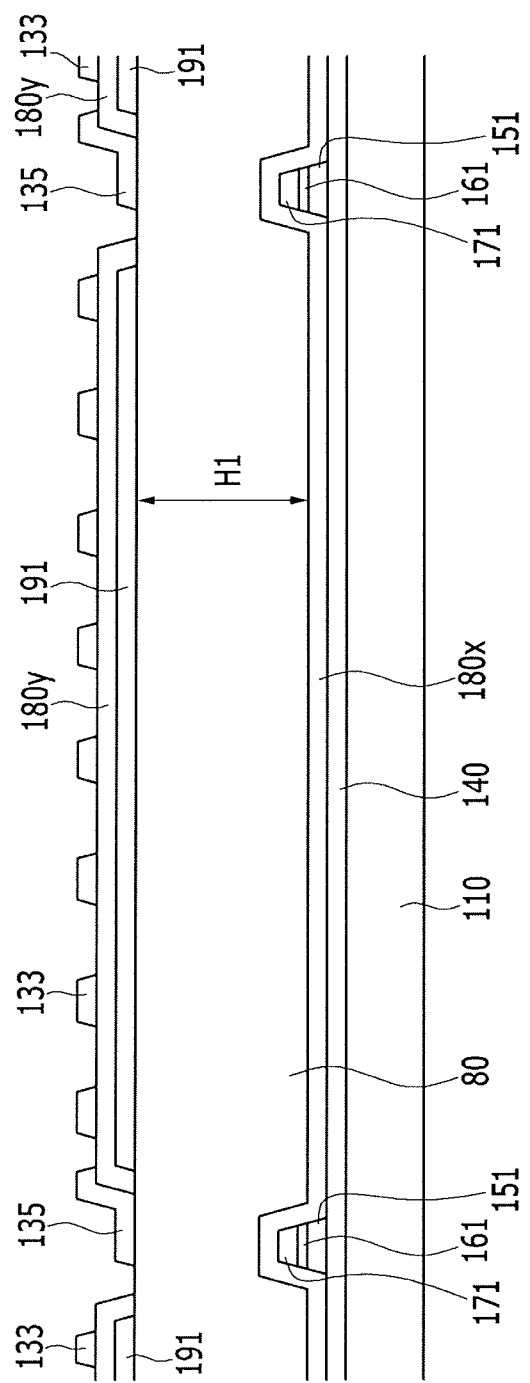
FIG. 24 is a cross-sectional view taken along line XXIV-XXIV of FIG. 23.
Figure 25:
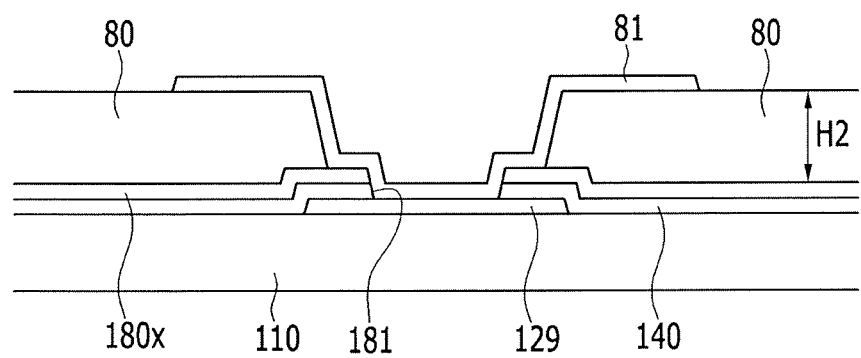
FIG. 25 is a cross-sectional view taken along line XXV-XXV of FIG. 23.
Figure 26:
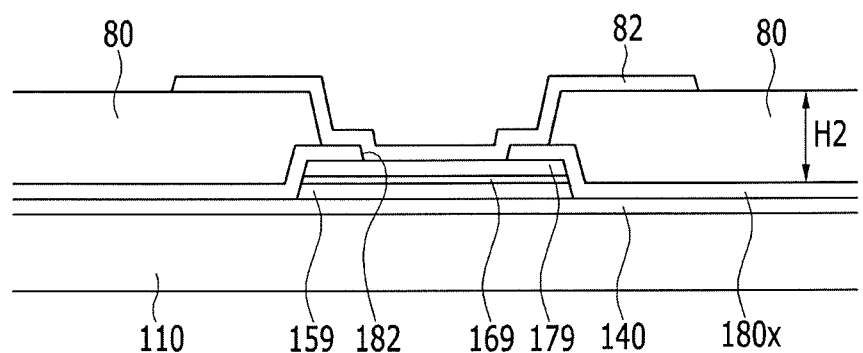
FIG. 26 is a cross-sectional view taken along line XXVI-XXVI of FIG. 23.

FIG. 23 is a layout view of a thin film transistor array panel according to an exemplary embodiment of the present invention, FIG. 24 is a cross-sectional view taken along line XXIV-XXIV of FIG. 23, FIG. 25 is a cross-sectional view taken along line XXV-XXV of FIG. 23, and FIG. 26 is a cross-sectional view taken along line XXVI-XXVI of FIG. 23.

Referring to FIG. 23 to FIG. 26, a plurality of gate conductors including a gate line 121 and a common voltage line 125 are formed on an insulation substrate 110.

The gate line 121 includes a plurality of gate electrodes 124 and a gate pad 129. The gate electrodes 124 protrude in a direction substantially perpendicular to the gate line 121. The gate pad 129 has a relatively wide area and is connected with another layer or an external driving circuit.

A gate insulating layer 140 is formed on the gate conductors 121, 125, and 129.

A semiconductor layer 151 is formed on the gate insulating layer 140. The semiconductor layer 151 each may have an expansion 154 that extends toward the gate electrodes 124. An ohmic contact 161 is disposed on the semiconductor layer 151. Alternatively, the ohmic contact may be omitted.

A plurality of data conductors including a data line 171, a plurality of drain electrodes 175, and a data pad 179 is formed on the ohmic contact 161. The data line 171 includes a plurality of source electrodes 173.

The first passivation layer 180x is formed on the data conductors 171, 175, and 179 and the exposed expansions 154 of the semiconductor layer 151. An organic layer 80 is formed on the first passivation layer 180x.

A first thickness H1 of the organic layer 80 positioned in a display area where a plurality of pixels are disposed to display an image is larger than a second thickness H2 of the organic layer 80 positioned in a peripheral area where the gate pad 129 or the data pad 179 is positioned.

According to an exemplary embodiment of the present invention, the organic layer 80 may be omitted.

The first passivation layer 180x, the organic layer 80, and the gate insulating layer 140 have a first contact hole 181 that exposes the gate pad 129.

The first passivation layer 180x and the organic layer 80 have a second contact hole 182 that exposes the data pad 179 and fifth contact hole 185 that exposes a portion of each drain electrode 175.

A pixel electrode 191 is formed on the organic layer 80. The pixel electrode 191 may have a planar shape that occupies substantially most of the portion enclosed by the gate line 121 and the data line 171. The overall shape of the pixel electrodes 191 may be a polygon having sides which are substantially parallel to the gate line 121 and the data line 171, and two opposite edges of the lower side where the thin film transistor is positioned may be chamfered, but the shape is not limited thereto. The pixel electrode 191 may be formed of a transparent conductive material such as ITO or IZO. The pixel electrode 191 receives a data voltage from the drain electrode 175 through the contact hole 181.

The second passivation layer 180y is formed on the pixel electrode 191.

The second passivation layer 180y includes a transparent photosensitive organic material. The second passivation layer 180y is thinner than the organic layer 80. The second passivation layer 180y has a dielectric constant of about 2 F/m to about 20 F/m.

The second passivation layer 180y covers a side surface of an edge of the pixel electrode 191. An upper portion and a side surface of the edge of the pixel electrode 191 are covered by the second passivation layer 180y that has a thickness of more than about 1 μm.

The second passivation layer 180y has substantially the same planar shape as the pixel electrode 191. An edge of the second passivation layer 180y protrudes from an edge of the pixel electrode 191 by more than about 1 μm.

The common electrode 131 is formed on the second passivation layer 180y.

The common electrode 131 includes two vertical portions 135 each covering the data line 171, a plurality of branch electrodes 133 which are positioned between the two vertical portions 135 and are separated from each other, and a lower horizontal portion 132a and an upper horizontal portion 132b which are connected with ends of the plurality of branch electrodes 133. The vertical portions 135 are substantially parallel to the data line 171. Each vertical portion 135 overlaps and covers a corresponding data line 171. The lower and upper horizontal portions 132a and 132b are substantially parallel to the data line 121. Each of the branch electrodes 133 is substantially parallel to each other. The branch electrodes 133 each form an oblique angle with respect to an extension direction of the gate line 121. The oblique angle may be about 45 degrees or more. Upper portions and lower portions of the branch electrodes 133 may be substantially symmetrical to each other with respect to a virtual horizontal center line of the common electrode 131. Common electrodes 131 adjacent to each other share one vertical portion 135 and are connected to each other.

The gate insulating layer 140, the first passivation layer 180x, and the organic layer 80 have a plurality of openings 186 that expose a portion (e.g., a portion of the expansion 126) of the common voltage line 125. The second passivation layer 180y is not disposed at the position where the opening 186 is formed.

The common electrode 131 receives a predetermined voltage, such as a common voltage, from the common voltage line 125 through the opening 186. The common electrode 131 according to an exemplary embodiment of the present invention overlaps the pixel electrode 191. At least two branch electrodes 133 of the common electrode 131, which are adjacent to each other, overlap one pixel electrode 191 which has a planar shape.

The first contact assistant 81 is formed on the gate pad 129 exposed through the first contact hole 181, and the second contact assistant 82 is formed on the data pad 179 exposed through the second contact hole 182.

The first contact assistant 81 and the second contact assistant 82 are formed on substantially the same layer as the common electrode 131.

The pixel electrode 191 is applied with a data voltage, generating an electric field in a liquid crystal layer along with the common electrode 131 that is applied with a common voltage.

According to an exemplary embodiment of the present invention, the second passivation layer 180y that is relatively thin includes a transparent photosensitive organic material. Accordingly, when the pixel electrode 191 is formed under the second passivation layer 180y, the second passivation layer 180y may be used as a photosensitive film, and thus, the second passivation layer 180y and the pixel electrode 191 may be substantially simultaneously formed. The second passivation layer 180y and the pixel electrode 191 may be formed using a same single photo-mask. Accordingly, the manufacturing cost of the liquid crystal display may be reduced.

FIG. 27, FIG. 30, FIG. 33, FIG. 36, and FIG. 39 sequentially show a method of manufacturing a thin film transistor array panel according to an exemplary embodiment of the present invention. FIG. 27, FIG. 30, FIG. 33, FIG. 36, and FIG. 39 are cross-sectional views taken along line XXIV-XXIV of FIG. 23. FIG. 28, FIG. 31, FIG. 34, FIG. 37, and FIG. 40 sequentially show a method of manufacturing a thin film transistor array panel according to an exemplary embodiment of the present invention. FIG. 28, FIG. 31, FIG. 34, FIG. 37, and FIG. 40 are cross-sectional views taken along line XXV-XXV of FIG. 23. FIG. 29, FIG. 32, FIG. 35, FIG. 38, and FIG. 41 sequentially show a method of manufacturing a thin film transistor array panel according to an exemplary embodiment of the present invention. FIG. 29, FIG. 32, FIG. 35, FIG. 38, and FIG. 41 are cross-sectional views taken along line XXVI-XXVI of FIG. 23.

Figure 27:
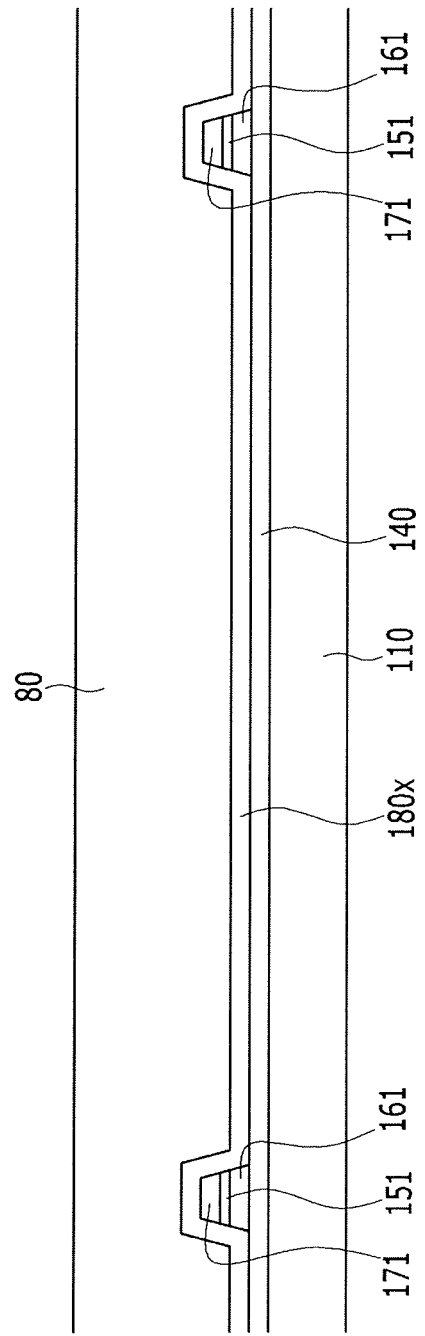
FIG. 27, FIG. 30, FIG. 33, FIG. 36, and FIG. 39 are cross-sectional views taken along line XXIV-XXIV of FIG. 23, sequentially showing a method of manufacturing a thin film transistor array panel according to an exemplary embodiment of the present invention.
Figure 28:
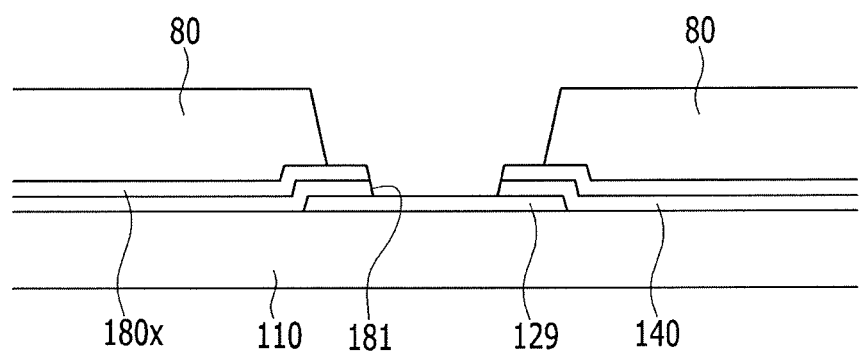
FIG. 28, FIG. 31, FIG. 34, FIG. 37, and FIG. 40 are cross-sectional views taken along line XXV-XXV of FIG. 23, sequentially showing a method of manufacturing a thin film transistor array panel according to an exemplary embodiment of the present invention.
Figure 29:
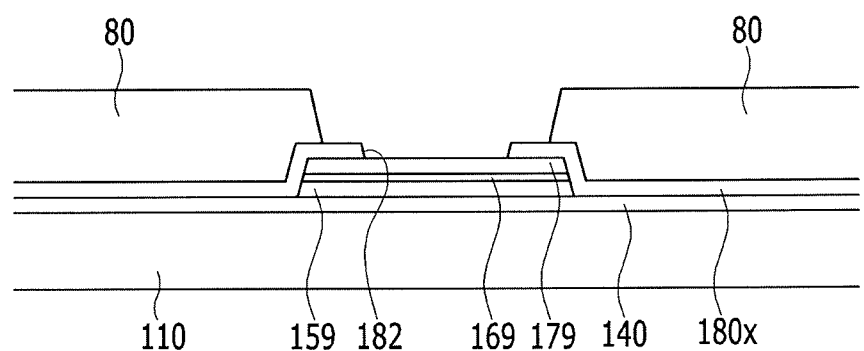
FIG. 29, FIG. 32, FIG. 35, FIG. 38, and FIG. 41 are cross-sectional views taken along the line XXVI-XXVI of FIG. 23, sequentially showing a method of manufacturing a thin film transistor array panel according to an exemplary embodiment of the present invention.

Referring to FIG. 27 to FIG. 29, gate conductors 121, 125, and 129 including a gate line 121, a common voltage line 125, and a gate pad 129 are formed on an insulation substrate 110, and a gate insulating layer 140 is formed on the gate conductors 121, 125, and 129. A semiconductor layer 151 having an expansion 154, a first semiconductor layer 159, an ohmic contact 161, a first ohmic contact 169, and data conductors 171, 175, and 179 including a data line 171, a drain electrode 175, and a data pad 179 are formed on the gate insulating layer 140.

A first passivation layer 180x is deposited on the data conductors 171, 175, and 179 and the exposed expansion 154 of the semiconductor layer 151. An organic layer 80 is deposited on the first passivation layer 180x.

A first contact hole 181 that exposes the gate pad 129 is formed through the first passivation layer 180x, the organic layer 80, and the gate insulating layer 140. A second contact hole 182 that exposes the data pad 179 is formed through the first passivation layer 180x and the organic layer 80. A third contact hole 183 that exposes a portion of the common voltage line 125 is formed through the first passivation layer 180x, the organic layer 80, and the gate insulating layer 140.

Figure 30:
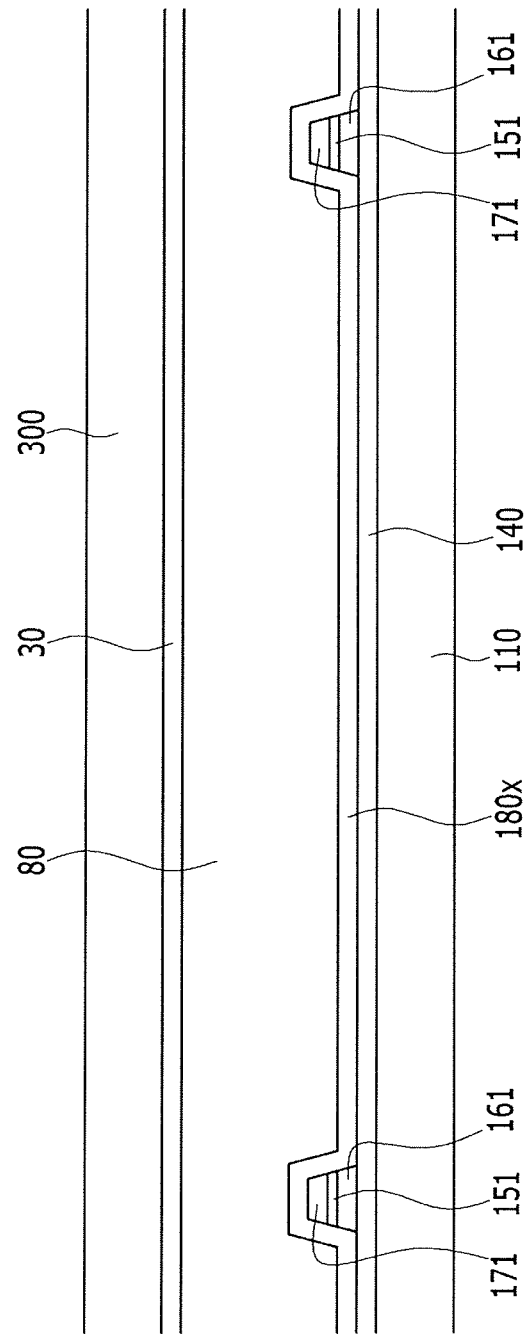
Figure 31:
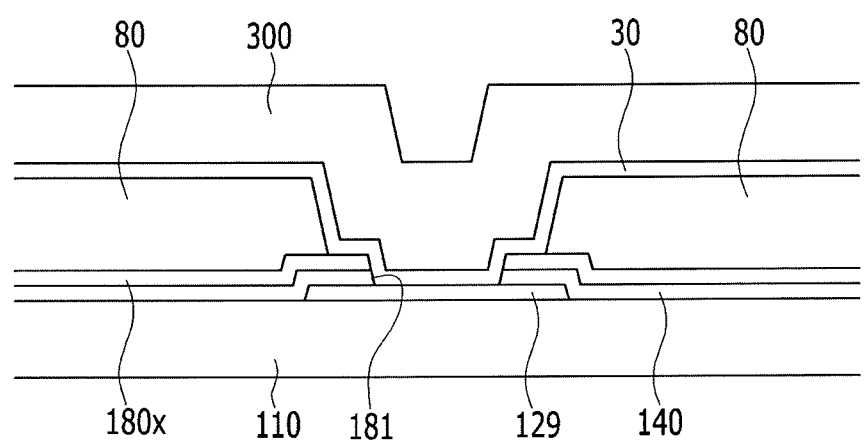
Figure 32:
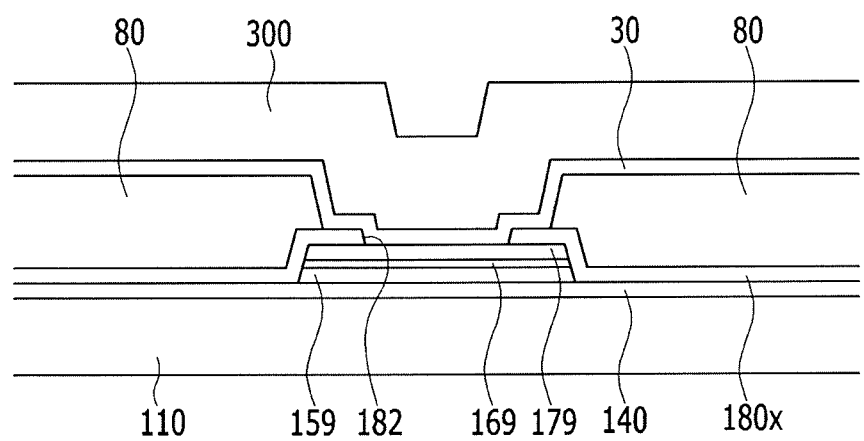

Referring to FIG. 30 to FIG. 32, a third layer 30 including a transparent conductor such as ITO or IZO is deposited on the organic layer 80, the gate pad 129, and a data pad 179. A third photosensitive organic layer 300 is deposited on the third layer 30. The third photosensitive organic layer 300 includes a transparent photosensitive organic material. The third photosensitive organic layer 300 is thinner than the organic layer 80. The third photosensitive organic layer 300 has a dielectric constant of about 2 F/m to about 20 F/m.

Figure 33:
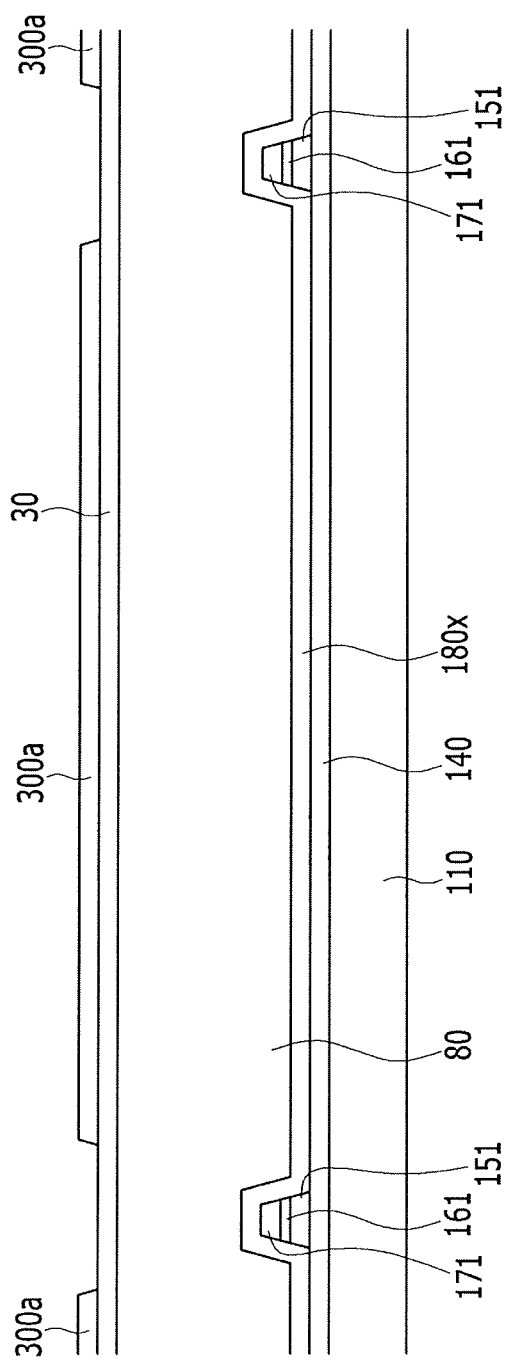
Figure 34:
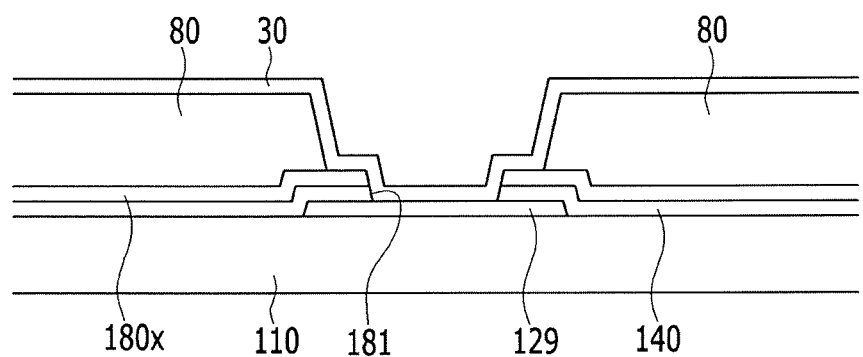
Figure 35:
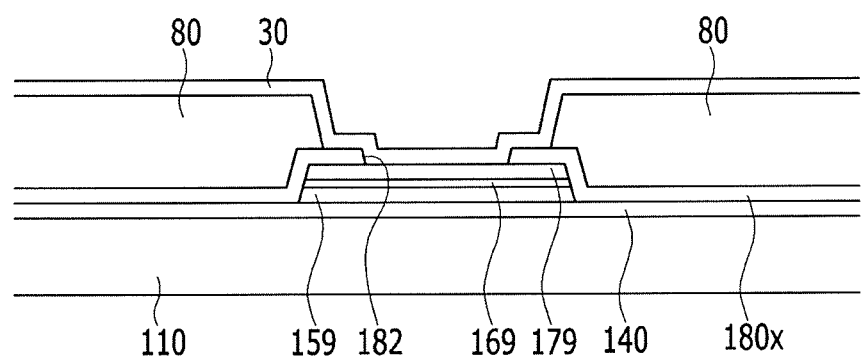

Referring to FIG. 33 to FIG. 35, the third photosensitive organic layer 300 is etched back to form a fourth photosensitive organic layer 300a that is relatively thin and has a flat surface. The fourth photosensitive organic layer 300a is disposed at the position where the pixel electrode 191 is formed, and the third photosensitive organic layer 300 positioned in the region corresponding to the gate pad 129 and the data pad 179 is removed.

According to an exemplary embodiment of the present invention, the third photosensitive organic layer 300 is deposited and then etched back, thus forming the thin fourth photosensitive organic layer 300a that has the flat surface. Alternatively, the thin photosensitive organic layer having the flat surface may be formed by a coating method.

Figure 36:
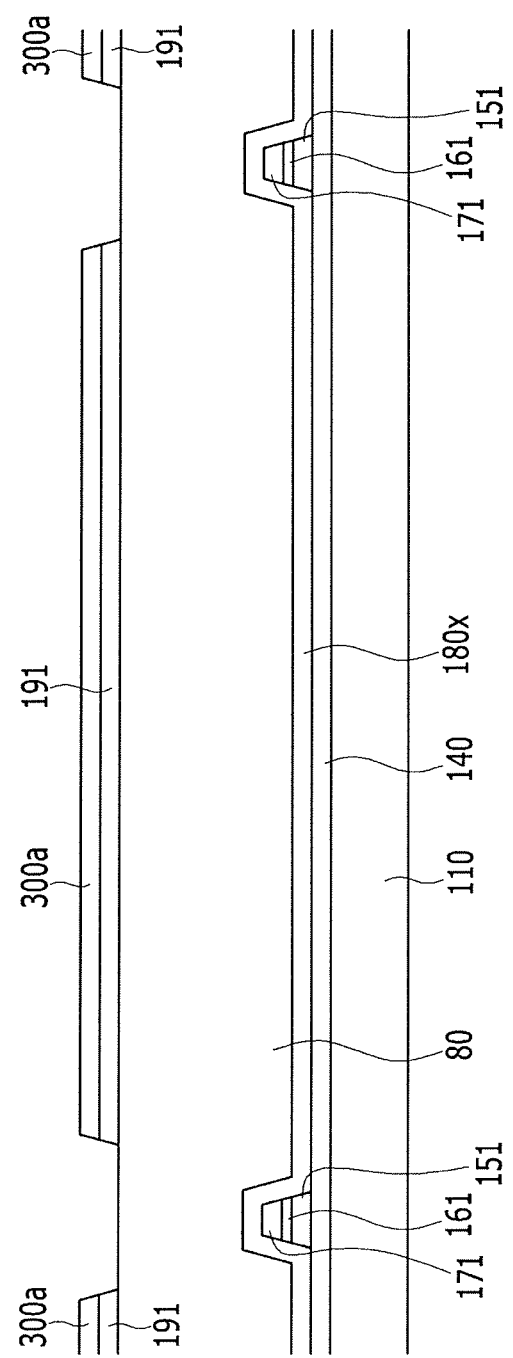
Figure 37:
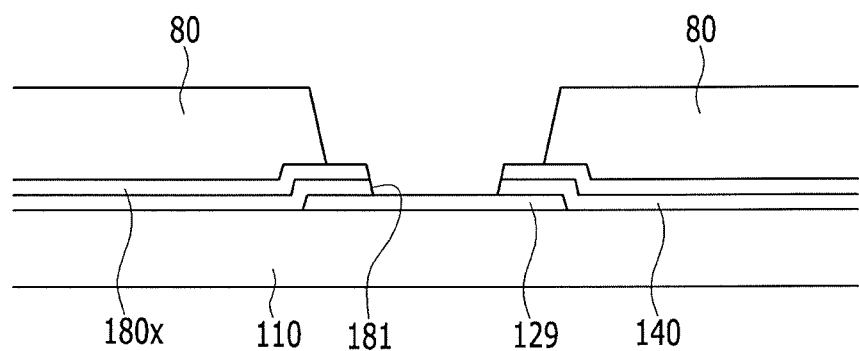
Figure 38:
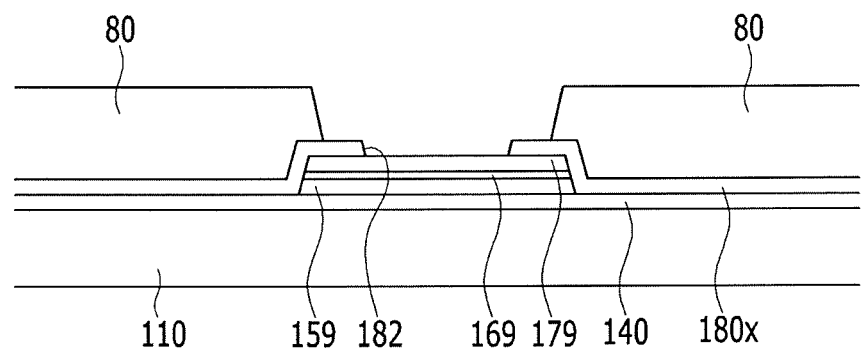

Referring to FIG. 36 to FIG. 38, the third layer 30 is etched using the fourth photosensitive organic layer 300a as an etching mask, forming a pixel electrode 191 and exposing the gate pad 129 and the data pad 179.

Figure 39:
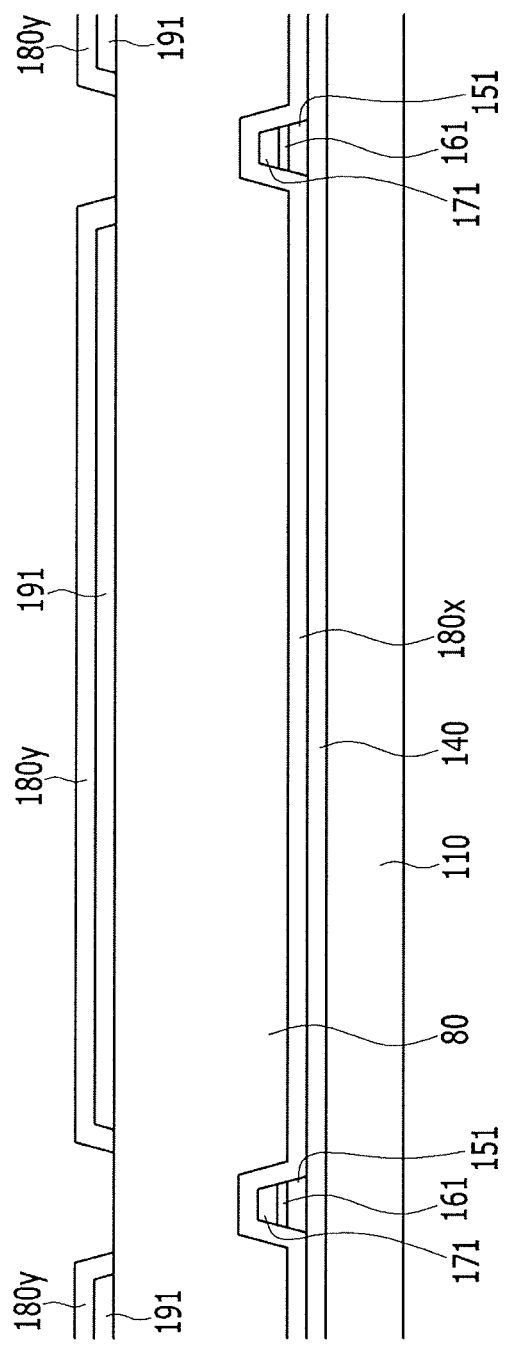
Figure 40:
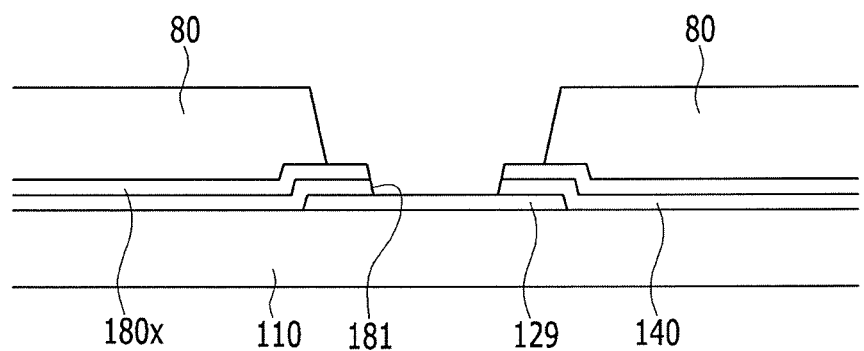
Figure 41:
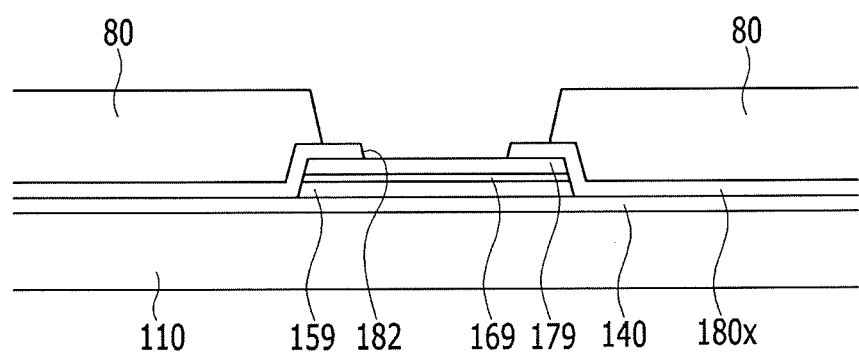

Referring to FIG. 39 to FIG. 41, the fourth photosensitive organic layer 300a is hard baked, forming the second passivation layer 180y covering a side surface of an edge of the pixel electrode 191.

An upper surface of the pixel electrode 191 and a side surface of the edge are covered by the second passivation layer 180y having a thickness of more than about 1 μm.

For example, the second passivation layer 180y has substantially the same planar shape as the pixel electrode 191. An edge of the second passivation layer 180y protrudes from an edge of the pixel electrode 191 by more than about 1 μm.

A transparent conductor layer such as ITO or IZO is deposited on the second passivation layer 180y, the gate pad 129, and the data pad 179. A photosensitive film is deposited on the transparent conductor layer and is then exposed and developed, forming a photosensitive film pattern. The transparent conductor layer is etched using the photosensitive film pattern as an etching mask, forming the common electrode 131, the first contact assistant 81, and the second contact assistant 82. The photosensitive film pattern is then removed, forming the thin film transistor array panel shown in FIG. 23 to FIG. 26.

According to an exemplary embodiment of the present invention, when the pixel electrode 191 is formed under the second passivation layer 180y, the second passivation layer 180y is formed using the photosensitive film, thereby substantially simultaneously forming the second passivation layer 180y and the pixel electrode 191. For example, the second passivation layer 180y and the pixel electrode 191 may be formed using a same single photo-mask. Accordingly, the manufacturing cost of the liquid crystal display may be reduced.

The above exemplary embodiments of the present invention may be applicable to a thin film transistor array panel in which the common electrode and the pixel electrode that function as two field generating electrodes, respectively, are disposed.

While exemplary embodiments of the present invention have been described with reference to the figures, it is to be understood by one of ordinary skill that the invention is not limited to the disclosed embodiments and various modifications may be made thereto.

What is claimed is:

1. A method of manufacturing a thin film transistor array panel, the method comprising:
   forming a gate line and a data line on an insulation substrate;
   forming a first passivation layer on the gate line and the data line;
   depositing a transparent conductor on the first passivation layer;
   forming a transparent photosensitive organic layer on the transparent conductor;
   etching the transparent conductor using the transparent photosensitive organic layer as an etching mask to form a first field generating electrode;
   hard-baking the transparent photosensitive organic layer to form a second passivation layer covering an upper surface of the first field generating electrode and a side surface of an edge of the first field generating electrode; and
   forming a second field generating electrode on the second passivation layer.

2. The method of claim 1, further comprising:
   depositing a transparent photosensitive organic material on the transparent conductor; and
   etching back the deposited transparent photosensitive organic material.

3. The method of claim 1, wherein
   the second passivation layer has substantially the same planar shape as the first field generating electrode, and wherein an edge of the second passivation layer protrudes from the edge of the first field generating electrode.

4. The method of claim 3, wherein
   the edge of the second passivation layer protrudes from the edge of the first field generating electrode by more than about 1 μm.

5. The method of claim 4, wherein
   the second passivation layer has a dielectric constant of about 2 F/m to about 20 F/m.

6. The method of claim 5, wherein
   one of the first field generating electrode or the second field generating electrode has a planar shape, and the other includes a branch electrode.

7. The method of claim 1, wherein
   the second passivation layer has a dielectric constant of about 2 F/m to about 20 F/m.

8. The method of claim 7, wherein
   one of the first field generating electrode or the second field generating electrode has a planar shape, and the other includes a branch electrode.

9. The method of claim 1, wherein
   one of the first field generating electrode or the second field generating electrode has a planar shape, and the other includes a branch electrode.

10. A method of manufacturing a transistor array panel, the method comprising:
    forming a signal line on a substrate;
    forming a first passivation layer on the signal line;
    forming a transparent conducting layer on the first passivation layer;
    forming a transparent photosensitive layer on the transparent conducting layer; and
    etching the transparent conducting layer using the transparent photosensitive layer as an etching mask to form a field generating electrode.

11. The method of claim 10, further comprising baking the transparent photosensitive layer to form a second passivation layer.

* * * * *